United States Patent
Musumeci et al.

(10) Patent No.: US 7,174,473 B2
(45) Date of Patent: Feb. 6, 2007

(54) START DETECTION CIRCUIT, STOP DETECTION CIRCUIT AND CIRCUIT FOR THE DETECTION OF DATA TRANSMITTED ACCORDING TO THE IIC PROTOCOL

(75) Inventors: Orazio Musumeci, Gela (IT); Ahmed Kari, Aix en Provence (FR)

(73) Assignee: STMicroelectronics S.R.L. (IT)

( * ) Notice: Subject to any disclaimer, the term of this patent is extended or adjusted under 35 U.S.C. 154(b) by 440 days.

(21) Appl. No.: 10/438,289

(22) Filed: May 13, 2003

(65) Prior Publication Data
US 2004/0010728 A1 Jan. 15, 2004

(30) Foreign Application Priority Data
May 14, 2002 (FR) .................... 02 05880

(51) Int. Cl.
*G06F 7/00* (2006.01)
(52) U.S. Cl. ..................... 713/400; 713/500
(58) Field of Classification Search ............... 713/400, 713/500
See application file for complete search history.

(56) References Cited

U.S. PATENT DOCUMENTS

| | | | |
|---|---|---|---|
| 5,418,821 A | | 5/1995 | Tran |
| 5,729,719 A | * | 3/1998 | Gates ..................... 713/400 |
| 5,878,234 A | * | 3/1999 | Dutkiewicz et al. ........ 710/110 |
| 5,903,737 A | * | 5/1999 | Han ........................ 710/100 |
| 5,905,755 A | | 5/1999 | Ficker |
| 5,940,599 A | * | 8/1999 | Urano et al. ............... 710/100 |
| 6,530,029 B1 | * | 3/2003 | Metchev .................... 713/500 |
| 2001/0022824 A1 | * | 9/2001 | Araki ........................ 375/360 |

FOREIGN PATENT DOCUMENTS

EP  1 137 180 A1  9/2001
GB  2 246 687 A   2/1992

OTHER PUBLICATIONS

XILINX "CoolRunner XPLA 12C Bus Controller Implementation" Jul. 21, 2000, XAPP333 v.1.4.*
FR Search Report 02 05880 Mar. 28, 2003 SI Microelectronics SA.
Patent Abstracts of Japan, vol. 008, No. 025 (E-225), Feb. 2, 1984, & JP 58 186218 a (hitachi seisakusho kk), Oct. 31, 1983 abrege.

* cited by examiner

*Primary Examiner*—Chun Cao
*Assistant Examiner*—Vincent Tran
(74) *Attorney, Agent, or Firm*—Lisa K. Jorgenson; J. Mark Han; Graybeal Jackson Haley LLP

(57) ABSTRACT

A start-detection circuit and a stop-detection circuit detect the start condition and the stop condition in a data signal associated with a clock signal according to the IIC protocol. The start-detection circuit comprises: a first detector to produce a first reset signal when a trailing edge of the data signal is detected; a counter to count pulses of a reference signal when the first reset signal is received, and to produce an enabling signal when the number of pulses counted has reached a predefined number; a second detector to store the enabling signal when a trailing edge of the clock signal is detected. The stop-detection circuit comprises a third detector to produce a stop signal when a leading edge of the data signal is detected after the detection of a leading edge of the clock signal.

28 Claims, 2 Drawing Sheets

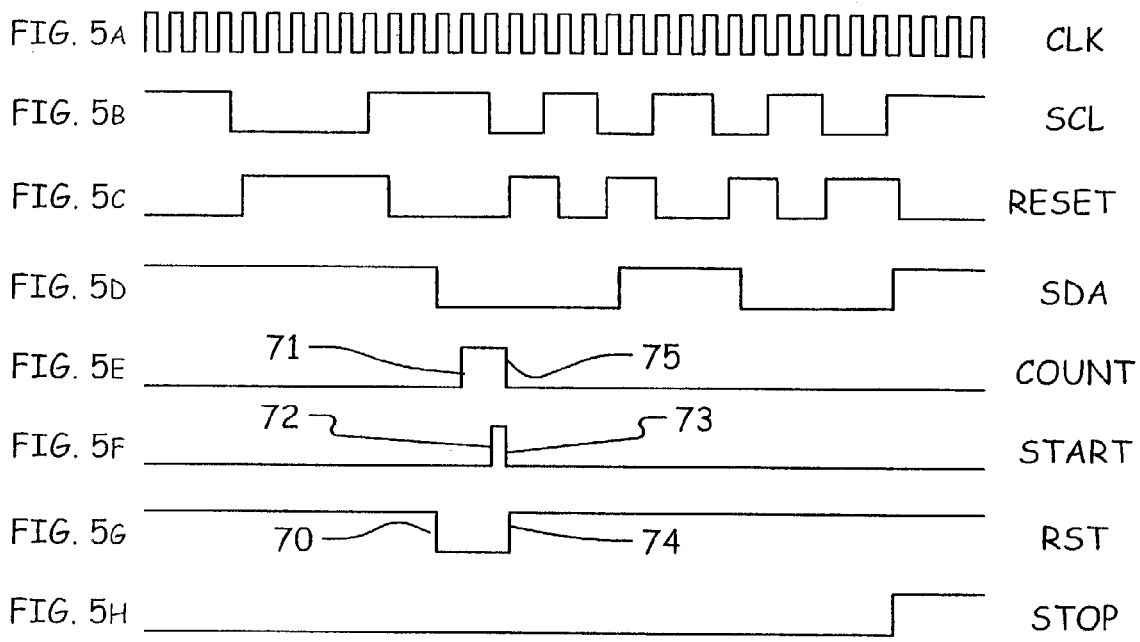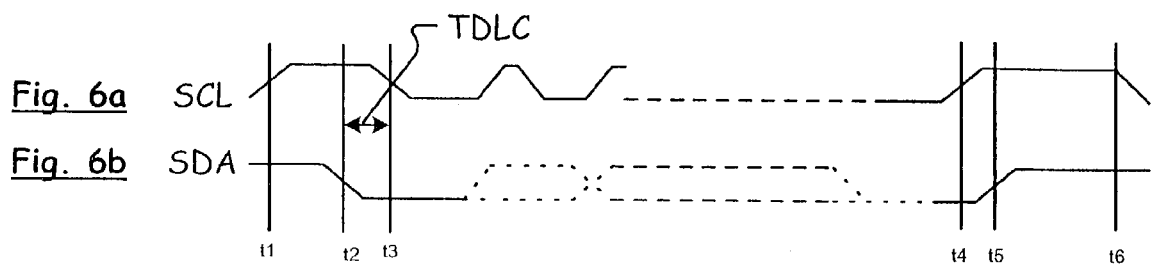

START DETECTION CIRCUIT, STOP DETECTION CIRCUIT AND CIRCUIT FOR THE DETECTION OF DATA TRANSMITTED ACCORDING TO THE IIC PROTOCOL

PRIORITY CLAIM

This application claims priority from French patent application No. 02 05880, filed May 14, 2002, which is incorporated herein by reference.

BACKGROUND OF THE INVENTION

1. Field of the Invention

The invention relates generally to a circuit for the detection of a start condition, a circuit for the detection of a stop condition, and a data-detection circuit to detect data sent on a bus according to the IIC protocol.

The IIC (Inter-Integrated Circuit) bus and the associated IIC protocol were developed in the 1980s to make it easy to connect electronic systems together. Initially designed for home equipment, they have now become a preferred means of configuring complex electronic components.

The IIC protocol can be used to set up communication between a very wide variety of electronic components by means of a bus that conveys only three signals: a data signal SDA containing data and/or addresses to be transmitted, a clock signal SCL setting the rate of the signal SDA, and an electrical reference (ground) signal.

This makes it possible to obtain equipment with very powerful functions (provided with all the power of microprogrammed systems) while keeping a printed circuit board that is very simple as compared with one having a classic circuit diagram.

Today, the IIC protocol has become a standard and there are many varied electronic components capable of communicating by means of this protocol: they include microprocessors, memories, boards etc.

The IIC protocol defines the succession of possible logic states on the signals SDA and SCL associated with an IIC bus connecting at least two components that have to communicate.

Each component connected to the bus constantly monitors the signals SDA and SCL, especially in order to know if the bus is free, if the data transmitted on the bus is intended for it (in the case of the slave component), or if the data that it transmits is accurately transmitted (in the case of the master component).

To take control of the bus in order to transmit data, the bus must initially be at rest. This corresponds to the state where the signals SDA and SCL are equal to "1".

After it has been verified that the bus is free, a component may take control of the bus; this component then becomes the master and imposes the clock signal SCL. It can then transmit data to one or more slave components.

To transmit one byte of data on the free bus, the master transmits a start condition message on the signal SDA. This start condition message indicates that the data will be transmitted. It is followed by a data byte to be transmitted and an enabling bit (where SDA is equal to 1). During this phase, a leading edge of the clock signal SCL enables each bit sent on the signal SDA. The slave (the addressee of the transmitted byte) then imposes a "0" on the signal SDA, thus, informing the master that it has accurately received the transmitted byte. Finally, the master transmits a stop condition signal on the signal SDA, to indicate that the bus will be released.

The start condition is fulfilled when the following conditions occur: with the signals SDA and SCL initially at "1" (bus idle, instant t1 in FIGS. 6a, 6b), the signal SDA goes to "0" (instant t2) while the signal SCL remains at "1" for at least a time TDLC after the trailing edge of the signal SDA (instant t3). If necessary, a minimum time TCHDX may be required between the last leading edge of SCL (instant t1) and the trailing edge of SDA (instant t2) to ensure that the bus is available.

The stop condition is fulfilled when the following conditions occur: with the signal SDA initially at "0" and the signal SCL initially at "1" (instant t4), the signal SDA goes to "1" (instant t5) while the signal SCL remains at "1". As the case may be, a minimum time TCHDH may be required between the leading edge of SCL (instant t4) and the leading edge of SDA (instant t5).

2. Description of the Prior Art

To monitor the signals SDA and SCL on the bus, the electronic components connected to the bus typically have a circuit for the detection of a start condition and/or a stop condition.

In a known way, detection circuits of this kind are made according to known analog schemes using resistors and capacitors. Specifically, they use delay circuits, based on inverters, capacitors and resistors, to measure the time between the leading edges and/or trailing edges of the signals SDA and SCL.

The resistors and capacitors have many drawbacks. These elements are large-sized in terms of silicon surface area occupied. Their resistance and/or their capacitance can change from one element to another, as a result of the process used to make them. Their resistance and/or their capacitance are furthermore imprecise and liable to drift in time, depending especially on the conditions of use.

Naturally, the drawbacks of the data detectors are the same as those of the resistors and capacitors that form them.

Therefore, a need has arisen for a detector that overcomes these problems of size and precision.

SUMMARY OF THE INVENTION

Thus, an embodiment of the invention relates to a start-detection circuit used to detect a start condition in a data signal associated with a clock signal according to the IIC protocol. According to this embodiment of the invention, the start detection circuit comprises: a first detector to produce a first reset signal when a trailing edge of the data signal is detected, a counter to count pulses of a reference signal when the first reset signal is received, and to produce an enabling signal when the number of pulses counted has reached a predefined number, and a second detector to store the enabling signal when a trailing edge of the clock signal is detected.

Thus, a circuit for the detection of a start condition according to this embodiment of the invention uses only digital circuits comprising no resistors or capacitors, so that the circuit of this embodiment of the invention does not exhibit the drawbacks related to resistors and capacitors. In particular, this embodiment makes use of a digital counter to measure a predefined time as shall be seen more clearly here below. It is then no longer necessary to use a delay circuit to fulfill this function.

The counter is reset when a trailing edge of the data signal is detected, and it produces the enabling signal when the predetermined time is reached, this predetermined time being equal to the predetermined number multiplied by the period of the reference signal. When a trailing edge of the clock signal is detected by the second detector, then the second detector stores a signal which is active if the enabling signal has been produced by the counter, or inactive if the predetermined time after the trailing edge of the data signal has not yet elapsed.

The start-detection circuit according to this embodiment of the invention is advantageously complemented by a reset circuit to produce a second reset signal equal to a signal that is the reverse of the clock signal and is synchronized with the reference signal, said second reset signal being used to reset the first detector and/or the second detector. The second reset signal disables the first detector and/or the second detector when the clock signal is inactive (that is when there cannot be any start condition), in dictating a predefined value (inactive) on the first reset signal and on the enabling signal.

The start-detection circuit according to this embodiment of the invention is also advantageously complemented by a disabling circuit, to stop the counter when the predetermined number is reached. The enabling signal is thus kept active, so long as it has not been used by the second detector.

Another embodiment of the invention relates to a stop-detection circuit, to detect a stop condition in a data signal associated with a clock signal according to the IIC protocol. According to this embodiment of the invention, the circuit comprises a third detector to produce a stop signal when a leading edge of the data signal is detected after the detection of a leading edge of the clock signal.

Finally, yet another embodiment of the invention also relates to a circuit for the detection of data transmitted according to the IIC protocol, comprising a start detection circuit and a stop detection circuit as described here above.

BRIEF DESCRIPTION OF THE DRAWINGS

The invention and the advantages that flow from it shall appear more clearly from the following description of exemplary embodiments of a circuit for the detection of a start condition and a circuit for the detection of a stop condition according to the invention. The description is to be read with reference to the appended drawings, of which:

FIGS. 5A–5H are timing diagrams of signals at different points of the circuits of FIGS. 1 to 4 according to an embodiment of the invention, and FIGS. 6a and 6b, already described, are timing diagrams of data signals transmitted according to the IIC protocol.

DETAILED DESCRIPTION

The start-detection circuit 10 according to an embodiment of the invention enables the detection of a start condition on the data signal SDA transmitted in association with a clock signal SCL according to the IIC protocol. The circuit 10 comprises (FIG. 1) a first detector 20, a counter 30, and a second detector 40.

The first detector 20 comprises an input to which the data signal SDA is applied and an output at which a first reset signal RST is produced. When it detects a trailing edge of the signal SDA, the detector 20 produces the active signal RST.

The counter 30 comprises a clock input to which a reference clock signal CLK is applied, and a resetting input connected to the output of the detector 20. The period TCLK of the reference signal CLK is chosen to be smaller than the period TSCL of the clock signal SCL. For example, if TSCL is in the range of 2.5 µs (transmission at 400 Kbits/s), then TCLK is chosen to be about 300 ns.

The counter 30 is incremented at each pulse of the signal CLK (for example, on an active edge of the signal CLK), and it produces an enabling signal COUNT when it reaches a predetermined number NB of counted pulses.

The counter 30 thus has the function of measuring a predefined time TDLC, equal to the number NB multiplied by the period TCLK, and of producing an enabling signal COUNT when this time has elapsed.

The detector 40 comprises a first input to which the signal COUNT is applied, a second input to which the clock signal SCL is applied, and an output. When it detects a trailing edge of the signal SCL, the detector 40 stores the signal COUNT, which is then available at the output of the detector 40 in the form of a signal START.

The circuit 10 works as follows (FIGS. 5A–5H). It is assumed that, initially, the signals SDA and SCL are active, equal to "1", that the signals COUNT, START are inactive, equal to "0", and that the signal RST is inactive, equal to "1". Finally, it is assumed that the number NB is equal to 2.

The detector 20 produces the active signal RST (herein, equal to "0", ref. 70, FIG. 5G) when it detects a trailing edge of the signal SDA. The signal RST enables the counter 30, which starts counting the pulses of the signal CLK. When the counter reaches the number NB, it produces the signal COUNT (ref. 71). When the detector 40 detects a trailing edge of the signal SCL, it produces the signal START (ref. 72) equal to the signal COUNT received at its data input.

If the counter has reached the number NB (that is, if the time TDLC has elapsed) before the trailing edge of SCL has been detected, then the signal START is equal to the signal COUNT, which is active: a start condition is detected (FIG. 5F).

Conversely, if the counter has not reached the number NB (that is, if the time TDLC has not yet elapsed) before the trailing edge of SCL is detected, then the signal START is equal to the signal COUNT, which is inactive: no start condition is detected.

Figure 2:
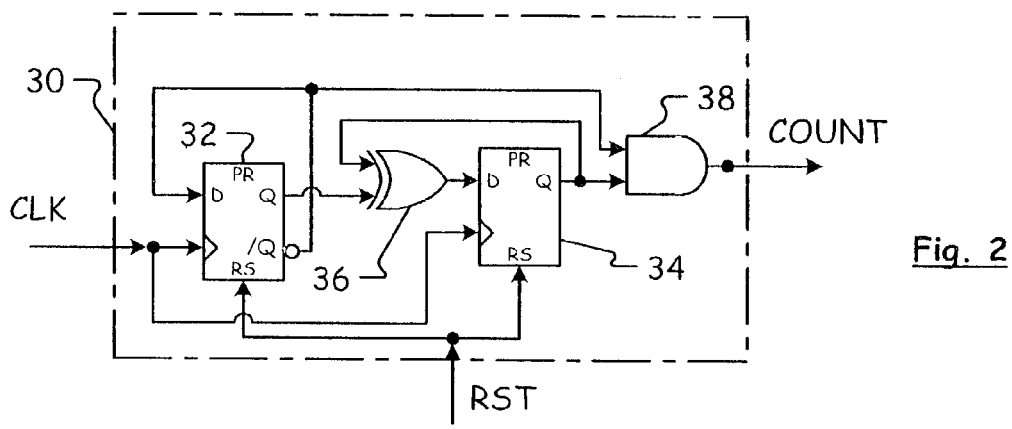
FIGS. 2 and 3 are exemplary embodiments of elements of FIG. 1.

In an exemplary embodiment, the counter 30 used is a two-bit counter comprising (FIG. 2) two D-type latch circuits 32, 34, one XOR gate 36 and one AND gate 38. Each of the latch circuits 32, 34 comprises a Q output, each connected to an input of the gate 36, an output of which is connected to a D input of the latch circuit 34. The Q output of the latch circuit 34 is also connected to an input of the gate 38, another input of which is connected to a D input and to a /Q inverter output of the latter circuit 32. Finally, each of the latch circuits 32, 34 comprises a clock input to which the reference signal CLK is applied, and an enabling input RS to which the signal RST is applied. An output of the gate 38 forms an output of the counter 30 at which the signal COUNT is produced.

In the example chosen, owing to the connections chosen for the AND gate 38, the counter 30 produces the signal COUNT when it reaches the number NB=2("1" at the /Q output of the latch circuit 32 and "1" at the Q output of the latch circuit 34).

In practice, the number NB is chosen as a function of the period of the reference signal CLK and of the minimum time TDLC to be guaranteed between the trailing edge of SDA (which starts the counter 30) and the trailing edge of the signal SCL (which enables or does not enable a start condition). In one example, the period of the signal CLK is equal to about 300 ns and NB is equal to 2. Thus, a start condition can be detected only if a minimum time of about 600 ns has elapsed between the trailing edge of the signal SDA and a trailing edge of the signal SCL.

Figure 1:
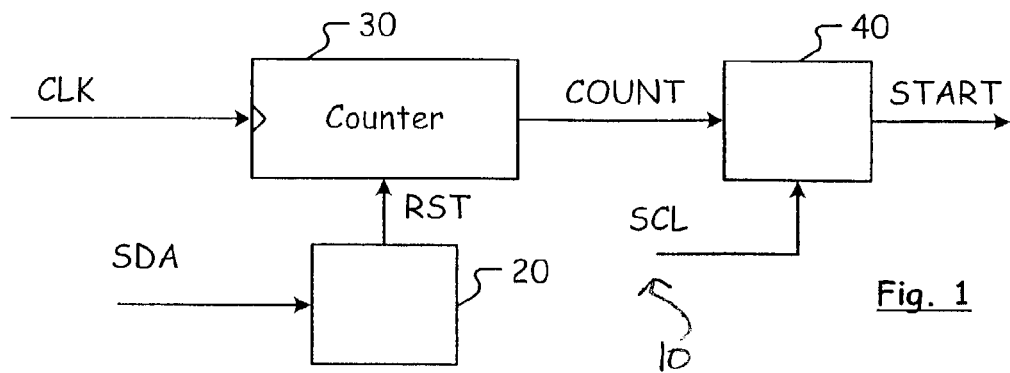
FIG. 1 is a functional diagram of the start detection circuit according to an embodiment of the invention.
Figure 3:
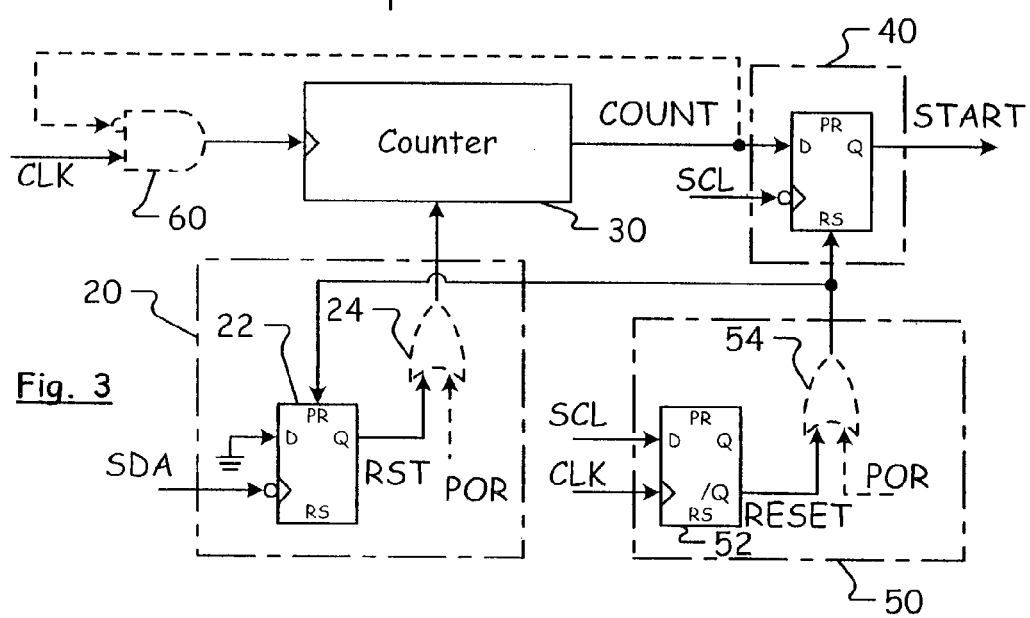

FIG. 3 gives a detailed view of exemplary embodiments of other elements of the circuit of FIG. 1.

The first detector 20 can be made with a D-type latch circuit 22, comprising a data input D connected to a ground of the circuit, a clock input to which a signal that is the complement of the signal SDA is applied, and a Q output at which the signal RST is produced. When it is active, the latch circuit 22 produces the signal RST, which is active at "0", at its output, whenever a trailing edge of the signal SDA is detected. The signal RST is used to reset the counter 30.

The detector 20 may have an OR gate 24 added to it. This OR gate 24 comprises two inputs to which the signal RST and a signal POR are applied, and an output connected to the reset input of the counter 30. The signal POR is a signal for the general powering on of the circuit 10, and is commonly used in electronic circuits. Naturally, if the detector 20 has no gate 24, the Q output of the latch circuit 22 is directly connected to the resetting input of the counter 30.

The detector 40 (FIG. 3) can be made similarly to the detector 20, from a D-type latch circuit, comprising a D data input connected to the output of the counter to receive the signal COUNT and an inverting clock input to which the signal SCL is applied. The latch circuit also comprises a Q data output at which the signal START is produced. When it is active, the latch circuit 40 produces the signal START, equal to the signal COUNT, at its output. This signal START is produced at each detection of a trailing edge of the signal SCL. The signal START is active if the counter has reached the number NB before the detection of the trailing edge of SCL. If not, START is inactive.

The circuit of FIG. 1 can advantageously be complemented by a resetting circuit 50, which produces a reset signal RESET. This signal RESET is equal to the complement of the signal SCL but is synchronized with the signal CLK. The signal RESET is used to reset and authorize the working of the detector 20 and/or the detector 40. Thus, any possible error of operation of the detectors 20, 40 and any unnecessary consumption of energy is avoided.

In one example (FIG. 3), the circuit 50 is formed by a D-type latch circuit 52, comprising a data input at which the signal SCL is applied, a clock input at which the signal CLK is applied, and /Q inverter output at which the signal RESET is produced.

The signal RESET is applied to enabling inputs of the detectors 20, 40: it disables the operation of these detectors when the signal SCL is at zero (because, in this case, there can be no start condition) in dictating a predefined (inactive) value on the signal RST, START. Thus, when the signal RESET becomes inactive and goes to "1", the signal START is cancelled (ref. 73) and the signal RST goes to "1", thus disabling the operation of and resetting the counter (ref. 75).

The signal RESET also authorizes the operation of the detectors when the signal SCL is equal to 1 (this is the case where a start condition is likely to appear).

It is also possible to apply the signal ISCL directly to the input PR of the latch circuit 22 (or the signal SCL to the RS input) to authorize the detection of a trailing edge of the signal SDA as soon as a trailing edge of SCL has been detected. This prevents the use of the signal RESET.

However, it is not possible to directly apply ISCL or SCL to one of the resetting inputs of the latch circuit 40: indeed, the application of the signal SCL both to the clock input and to an enabling input of the latch circuit 40 would disable the latch circuit upon the appearance of the trailing edge of SCL and the signal START would be always zero. There can be no detection of a start condition in this situation.

In the same way as the detector 20, and for the same reasons, the resetting circuit 50 may have a gate 54, for example, an OR-type gate, added to it. This gate 54 comprises an input to which the signal RESET is applied, an input to which the signal POR is applied, and an output connected to an enabling input PR of the detector 20 and/or to an input RS for enabling the detector 40.

The circuit 10 may be advantageously complemented by a disabling circuit 60 whose function is disable the counter 30 when it reaches the predefined number NB. The circuit 60 is connected between the output and the clock input of the counter 30; the circuit 60 produces a signal that is equal to the reference signal CLK when the number NB has not yet been reached by the counter 30. This signal produced by the circuit 60 takes a constant value (for example, zero) when the counter reaches the number NB. Thus, with the counter no longer receiving any pulses at its clock input, its operation is disabled and its output is kept constant: the signal COUNT is kept active.

Figure 4:
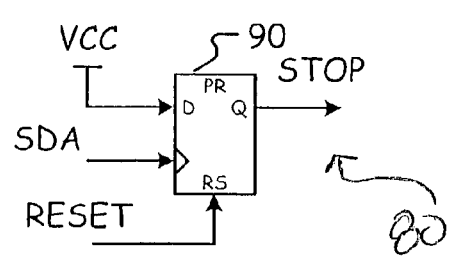
FIG. 4 is a drawing of a stop detection circuit according to an embodiment of the invention.

The stop-detection circuit according to an embodiment of the invention comprises (FIG. 4) a third detector 80, which produces a signal STOP when it detects a stop condition on the data signal SDA. In the example of FIG. 4, the third detector 80 is formed by a D-type latch circuit 90, comprising a data input to which a supply voltage VCC for the circuit is applied, a clock input to which the signal SDA is applied and a Q data output at which a signal STOP is produced. When it is active, the third detector 80 thus produces an active signal STOP at each leading edge of the signal SDA.

The circuit 80 of FIG. 4 may be complemented by a resetting circuit to authorize the working of the latch circuit 90 only when the signal SCL is active (i.e, at "1"), and, when this is not the case, to dictate an inactive signal STOP (equal in the example to "0"). A reset signal of this kind may be identical to the signal produced by the circuit 50 of FIG. 3. Naturally, if the circuits of FIGS. 3 and 4 are integrated into one and the same general circuit, a single resetting circuit 50 is sufficient.

The start-detection circuit 10 (FIG. 1), the stop-detection circuit 80 (FIG. 4), or both the circuits 10 and 80 may be incorporated into an integrated circuit (not shown) such as a memory or processor. Furthermore, an electronic system (not shown), such as a computer system, may include such integrated circuits that communicate with each other over an IIC bus.

The preceding discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

What is claimed is:

1. A start detection circuit to detect a start condition in a data signal associated with a clock signal according to the IIC protocol, the circuit comprising:
   a first detector to produce a first reset signal when a trailing edge of the data signal is detected;

a counter to count pulses of a reference signal when the first reset signal is received, and to produce an enabling signal when the number of pulses counted has reached a predefined number; and a second detector to store the enabling signal when a trailing edge of the clock signal is detected.

2. A circuit according to claim 1, also comprising a disabling circuit to stop the counter when the predetermined number is reached.

3. A circuit for the detection of data transmitted according to the IIC protocol, comprising a start detection circuit according to claim 1, and a stop detection circuit to detect a stop condition on a data signal associated with a clock signal according to the IIC protocol, the circuit comprising a third detector, to produce a stop signal when a leading edge of the data signal is detected after the detection of a leading edge of the clock signal.

4. A start detection circuit to detect a start condition in a data signal associated with a clock signal according to the IIC protocol, the circuit comprising:
 a first detector to produce a first reset signal when a trailing edge of the data signal is detected;
 a counter to count pulses of a reference signal when the first reset signal is received, and to produce an enabling signal when the number of pulses counted has reached a predefined number; and
 a second detector to store the enabling signal when a trailing edge of the clock signal is detected; and
 a reset circuit to produce a second reset signal equal to a signal that is the complement of the clock signal and is synchronized with the clock reference signal, said second reset signal being used to reset the first detector and/or the second detector.

5. A start detection circuit to detect a start condition in a data signal associated with a clock signal according to the IIC protocol, the circuit comprising:
 a first detector to produce a first reset signal when a trailing edge of the data signal is detected, wherein the first detector comprises a latch circuit comprising a data input connected to a ground of the circuit, a clock input to which the data signal is applied, and a data output at which the first reset signal is produced;
 a counter to count pulses of a reference signal when the first reset signal is received, and to produce an enabling signal when a number of pulses counted has reached a predefined number; and
 a second detector to store the enabling signal when a trailing edge of the clock signal is detected.

6. A circuit according to claim 5, wherein the first detector also comprises a gate comprising two data inputs to which the first reset signal and a powering-on signal are applied, and an output connected to a reset input of the counter.

7. A start detection circuit to detect a start condition in a data signal associated with a clock signal according to the IIC protocol, the circuit comprising:
 a first detector to produce a first reset signal when a trailing edge of the data signal is detected;
 a counter to count pulses of a reference signal when the first reset signal is received, and to produce an enabling signal when the number of pulses counted has reached a predefined number; and
 a second detector to store the enabling signal when a trailing edge of the clock signal is detected, wherein the second detector comprises a D-type latch comprising a data input to which the enabling signal is applied and a clock input to which the clock signal is applied.

8. A start detection circuit to detect a start condition in a data signal associated with a clock signal according to the IIC protocol, the circuit comprising:
 a first detector to produce a first reset signal when a trailing edge of the data signal is detected;
 a counter to count pulses of a reference signal when the first reset signal is received, and to produce an enabling signal when a number of pulses counted has reached a predefined number;
 a second detector to store the enabling signal when a trailing edge of the clock signal is detected; and
 a disabling circuit to stop the counter when the predetermined number is reached, wherein the disabling circuit comprises a gate comprising two inputs to which the enabling signal and the reference signal are applied respectively, and an output connected to a clock input of the counter.

9. A start detection circuit to detect a start condition in a data signal associated with a clock signal according to the IIC protocol, the circuit comprising:
 a first detector to produce a first reset signal when a trailing edge of the data signal is detected;
 a counter to count pulses of a reference signal when the first reset signal is received, and to produce an enabling signal when a number of pulses counted has reached a predefined number;
 a second detector to store the enabling signal when a trailing edge of the clock signal is detected; and
 a reset circuit to produce a second reset signal equal to a signal that is the complement of the clock signal and is synchronized with the clock reference signal, said second reset signal being used to reset the first detector and/or the second detector, wherein the reset circuit comprises a latch circuit comprising a data input to which the clock signal is applied, a clock input to which the reference signal is applied, and an output at which a second reset signal is produced.

10. A circuit according to claim 9, wherein the reset circuit also comprises a gate comprising two inputs to which the second reset signal and the powering-on signal are applied, and an output connected to a reset input of the first detector and/or to a reset input of the second detector.

11. A stop detection circuit to detect a stop condition on a data signal associated with a clock signal according to the IIC protocol, the circuit comprising a detector, to produce a stop signal when a leading edge of the data signal is detected after the detection of a leading edge of the clock signal, also comprising a reset circuit to produce a second reset signal equal to a signal that is the inverse of the clock signal and synchronized with a reference signal, said second reset signal being used to reset the detector.

12. A circuit according to claim 11, wherein the detector comprises a latch circuit comprising a data input to which a power supply voltage is applied, a clock input to which the data signal is applied and an output at which a stop signal is produced.

13. A start-detection circuit, comprising:
 a first logic circuit operable to detect an edge of a first IIC signal; and
 a second logic circuit coupled to the first logic circuit and operable to generate a start signal in response to detecting an edge of a second IIC signal at least a predetermined time after the first logic circuit detects the edge of the first IIC signal, the predetermined time being derived from a reference signal that is independent of the first and second IIC signals.

14. The start-detection circuit of claim 13 wherein:
the first IIC signal comprises an IIC data signal; and
the second IIC signal comprises an IIC clock signal.

15. The start-detection circuit of claim 13 wherein the edges of the first and second IIC signals respectively comprise falling edges.

16. The start-detection circuit of claim 13 wherein:
the second logic circuit comprises a counter and is operable to generate the start signal if the counter has counted to or beyond a predetermined value when the second logic circuit detects the edge of the second IIC signal; and
the first logic circuit is operable to enable the counter in response to detecting the edge of the first IIC signal.

17. The start-detection circuit of claim 13 wherein the first logic circuit comprises a flip-flop having a clock node operable to receive the first IIC signal.

18. A stop-detection logic circuit operable to generate a stop signal in response to detecting an edge of a data signal while a clock signal has a predetermined value, the stop-detection logic circuit further comprising a flip-flop having:
a clock node operable to receive the data signal; and
a reset node operable to receive a reset signal, the reset signal being derived from the clock signal and being synchronized with a second clock signal that is independent of the first clock signal.

19. The stop-detection logic circuit of claim 18 wherein:
the data signal comprises an IIC data signal; and
the clock signal comprises an IIC clock signal.

20. The stop-detection logic circuit of claim 18 wherein:
the edge of the data signal comprises a rising edge; and
the predetermined value comprises a high logic level.

21. An integrated circuit, comprising:
a start-detection circuit, comprising,
a first logic circuit operable to detect an edge of a first IIC signal, and
a second logic circuit coupled to the first logic circuit and operable to generate a start signal in response to detecting an edge of a second IIC signal at least a predetermined time after the first logic circuit detects the edge of the first IIC signal, the predetermined time being derived from a reference signal that is independent of the first and second IIC signals.

22. An integrated circuit, comprising:
a stop-detection logic circuit operable to generate a stop signal in response to detecting an edge of a data signal while a clock signal has a predetermined value, wherein the stop-detection logic circuit further includes a flip-flop having:
a clock node operable to receive the data signal; and
a reset node operable to receive a reset signal, the reset signal being derived from the clock signal and being synchronized with a second clock signal that is independent of the first clock signal.

23. An electronic system, comprising:
a data line operable to carry an IIC data signal;
a clock line operable to carry an IIC clock signal; and
an integrated circuit coupled to the data and clock lines and including,
a start-detection circuit, comprising,
a first logic circuit operable to detect an edge of the IIC data signal, and
a second logic circuit coupled to the first logic circuit and operable to generate a start signal in response to detecting an edge of the IIC clock signal at least a predetermined time after the first logic circuit detects the edge of the IIC data signal, the predetermined time being derived from a reference signal that is independent of the first and second IIC signals.

24. The electronic system of claim 23 wherein the first integrated circuit further comprises a stop-detection circuit operable to generate a stop signal in response to detecting an edge of the IIC data signal while the IIC clock signal has a predetermined value.

25. An electronic system, comprising:
a data line operable to carry a data signal;
a clock line operable to carry a clock signal; and
a first integrated circuit coupled to the data and clock lines and including,
a stop-detection logic circuit operable to generate a stop signal in response to detecting an edge of the data signal while the clock signal has a predetermined value wherein the stop-detection logic circuit further includes a flip-flop having:
a clock node operable to receive the data signal; and
a reset node operable to receive a reset signal, the reset signal being derived from the clock signal and being synchronized with a second clock signal that is independent of the first clock signal.

26. A method, comprising:
detecting an edge of a first IIC signal with a first logic circuit; and
generating a start signal with a second logic circuit in response to detecting an edge of a second IIC signal at least a predetermined time after detecting the edge of the first IIC signal, the predetermined time being derived from a reference signal that is independent of the first and second IIC signals.

27. The method of claim 26 wherein generating the start signal comprises:
counting a number of predetermined intervals between the edge of the first IIC signal and the edge of the second IIC signal; and
generating the start signal only if the number of predetermined intervals equals or exceeds a predetermined value.

28. A method, comprising:
detecting an edge of a data signal with a logic circuit; and
generating a stop signal with the logic circuit if a first clock signal has a predetermined value; and
generating a reset signal derived from the first clock signal, the reset signal being synchronized with the a second clock signal that is independent of the first clock signal.

* * * * *

UNITED STATES PATENT AND TRADEMARK OFFICE
CERTIFICATE OF CORRECTION

PATENT NO. : 7,174,473 B2 Page 1 of 1
APPLICATION NO. : 10/438289
DATED : February 6, 2007
INVENTOR(S) : Musumeci et al.

It is certified that error appears in the above-identified patent and that said Letters Patent is hereby corrected as shown below:

Column 10, line 55, the portion of the claim reading "with the a" should be changed to --with a--.

Signed and Sealed this

Second Day of June, 2009

JOHN DOLL
*Acting Director of the United States Patent and Trademark Office*